(12) United States Patent
Lee et al.

(10) Patent No.: US 8,841,211 B2
(45) Date of Patent: Sep. 23, 2014

(54) METHODS FOR FORMING INTERCONNECT STRUCTURES

(75) Inventors: Joung Joo Lee, San Jose, CA (US); Xianmin Tang, San Jose, CA (US); Tza-Jing Gung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

(21) Appl. No.: 13/153,992

(22) Filed: Jun. 6, 2011

(65) Prior Publication Data

US 2011/0306200 A1    Dec. 15, 2011

Related U.S. Application Data

(60) Provisional application No. 61/353,175, filed on Jun. 9, 2010.

(51) Int. Cl.
| | | |
|---|---|---|
| *H01L 21/4763* | (2006.01) | |
| *H01L 21/285* | (2006.01) | |
| *C23C 14/34* | (2006.01) | |
| *H01L 21/768* | (2006.01) | |
| *C23C 14/04* | (2006.01) | |

(52) U.S. Cl.
CPC .......... *H01L 21/2855* (2013.01); *C23C 14/345* (2013.01); *C23C 14/3492* (2013.01); *H01L 21/76882* (2013.01); *C23C 14/046* (2013.01)
USPC ............... 438/632; 438/677; 257/E21.478

(58) Field of Classification Search
CPC ................. H01I 21/76882; H01L 21/76883
USPC ............... 438/799, 677, 632; 257/E21.477, 257/E21.478
See application file for complete search history.

(56) References Cited

U.S. PATENT DOCUMENTS

| | | | |
|---|---|---|---|
| 5,789,317 A | | 8/1998 | Batra et al. |
| 5,843,843 A | * | 12/1998 | Lee et al. ............... 438/688 |
| 5,976,327 A | * | 11/1999 | Tanaka ............... 204/192.15 |
| 5,981,382 A | * | 11/1999 | Konecni et al. ............... 438/646 |

(Continued)

FOREIGN PATENT DOCUMENTS

| | | | | |
|---|---|---|---|---|
| JP | 2008-045219 A | * | 2/2008 | ............ H01L 21/285 |
| KR | 10-2001-0046538 A | | 6/2001 | |

OTHER PUBLICATIONS

Translation of JP2008-045219A (Kobayashi et al ) Feb. 2008, 13 pages.*

(Continued)

*Primary Examiner* — Caridad Everhart
(74) *Attorney, Agent, or Firm* — Moser Taboada; Alan Taboada

(57) ABSTRACT

Methods for forming interconnect structures are provided herein. In some embodiments, a method for forming an interconnect on a substrate may include depositing a material atop an upper surface of the substrate and atop one or more surfaces of a feature disposed in the substrate by a first deposition process that deposits the material at a faster rate on the upper surface than on a bottom surface of the feature; depositing the material atop the upper surface of the substrate and atop one or more surfaces of the feature by a second deposition process that deposits the material at a greater rate on the bottom surface of the feature than on the upper surface of the substrate; and heating the deposited material to draw the deposited material towards the bottom surface of the feature to at least partially fill the feature with the deposited material.

22 Claims, 4 Drawing Sheets

(56) References Cited

U.S. PATENT DOCUMENTS

| | | | |
|---|---|---|---|
| 6,352,926 B1 | 3/2002 | Ding et al. | |
| 6,881,673 B2 | 4/2005 | Ding et al. | |
| 7,790,626 B2* | 9/2010 | Ikeda et al. | 438/758 |
| 7,964,504 B1* | 6/2011 | Shaviv et al. | 438/680 |
| 2005/0263890 A1 | 12/2005 | Han et al. | |
| 2006/0189115 A1* | 8/2006 | Sakai et al. | 438/603 |
| 2006/0258152 A1* | 11/2006 | Haider | 438/644 |
| 2007/0224793 A1* | 9/2007 | Cerio, Jr. | 438/597 |
| 2009/0087585 A1* | 4/2009 | Lee et al. | 427/576 |
| 2009/0194875 A1* | 8/2009 | Yang et al. | 257/751 |
| 2010/0167540 A1* | 7/2010 | Sakuma et al. | 438/676 |
| 2011/0097897 A1* | 4/2011 | Tanaka | 438/653 |

OTHER PUBLICATIONS

International Search Report and Written Opinion mailed Feb. 9, 2012 for PCT Application No. PCT/US2011/039414.

* cited by examiner

METHODS FOR FORMING INTERCONNECT STRUCTURES

CROSS-REFERENCE TO RELATED APPLICATIONS

This application claims benefit of U.S. provisional patent application Ser. No. 61/353,175, filed Jun. 9, 2010, which is herein incorporated by reference.

FIELD

Embodiments of the present invention generally relate to methods for processing substrates, and more specifically to methods for forming interconnect structures.

BACKGROUND

As the critical dimensions of semiconductor devices continue to shrink, more precise processing is required to enable functional devices at smaller scales. For example, the inventors have discovered that structures, such as a vias, trenches, dual damascene structures, or other structures having high aspect ratios (e.g., a feature height to width ratio of greater than about 4:1) and/or critical dimensions of less than about 22 nm, are often not sufficiently metalized during conventional processing. For example, the inventors have discovered that methods such as physical vapor deposition or the like do not achieve adequate deposition of the metal on lower portions of the structure, such as bottom surfaces of a via or trench, causing voids or other defects in the structure. Such defects may result in failure of the device.

Accordingly, the inventors have provided improved methods of forming interconnect structures.

SUMMARY

Methods for forming interconnect structures are provided herein. In some embodiments, a method for forming an interconnect on a substrate may include depositing a material atop an upper surface of the substrate and atop one or more surfaces of a feature disposed in the substrate by a first deposition process that deposits the material at a faster rate on the upper surface than on a bottom surface of the feature; depositing the material atop the upper surface of the substrate and atop one or more surfaces of the feature by a second deposition process that deposits the material at a greater rate on the bottom surface of the feature than on the upper surface of the substrate; and heating the deposited material to draw the deposited material towards the bottom surface of the feature to at least partially fill the feature with the deposited material. In some embodiments, the aforementioned selective deposition and heating processes may be repeated until the feature is filled with the deposited material.

In some embodiments, a method of forming a layer in a feature disposed in a substrate may include depositing a material on an upper surface of the substrate and within a feature disposed in the substrate by a first deposition process; continuing to deposit the material on the upper surface of the substrate and within the feature by a second deposition process, wherein one of the first deposition process or the second deposition process deposits the material at a faster rate on the upper surface of the substrate than on a bottom surface of the feature, and wherein the other of the first deposition process or the second deposition process deposits the material at a greater rate on the bottom surface of the feature than on the upper surface of the substrate; and heating the deposited material to draw the deposited material towards the bottom surface of the feature to at least partially fill the feature with the deposited material.

In some embodiments, a computer readable medium may be provided having instructions stored thereon that, when executed by a processor, cause a process chamber to perform any of the methods disclosed herein. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
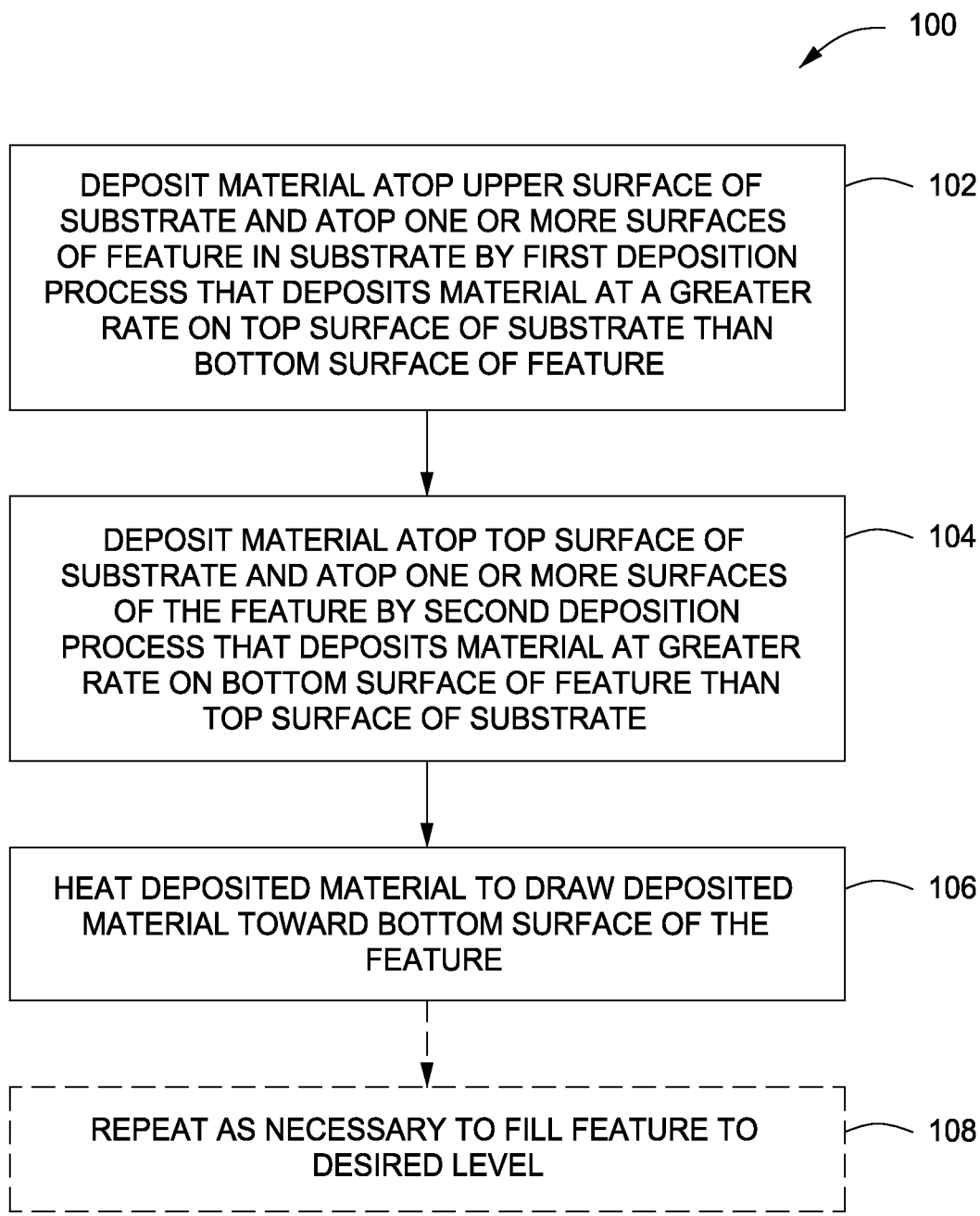
FIG. 1 depicts a flow chart for a method for forming an interconnect structure in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming interconnect structures are disclosed herein. The inventive methods advantageously facilitate the metallization of features, such as vias and trenches, with limited or no voids or defects within the feature. The inventive methods are particularly useful for metalizing features having high aspect ratios (e.g., about 4:1 or greater) and/or critical dimensions of about 22 nm or less.

Figure 2A:
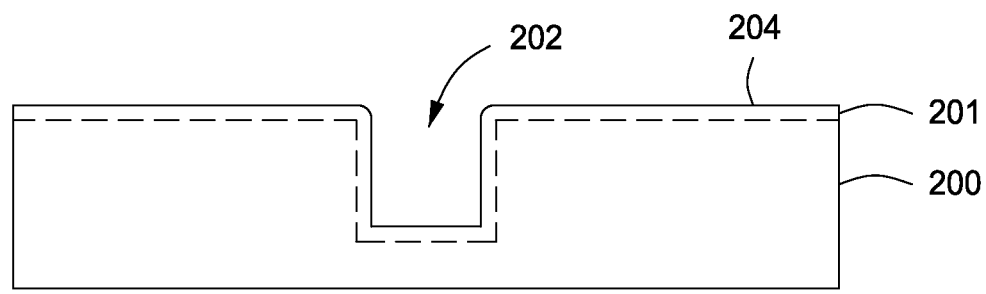
FIG. 2 depicts stages of fabrication of an interconnect structure in accordance with some embodiments of the present invention.

FIG. 1 depicts a flow chart for a method 100 for forming an interconnect structure in accordance with some embodiments of the present invention. The method 100 is described below in accordance with the stages of fabrication for a feature 202, such as an interconnect structure, in a substrate 200 as depicted in FIGS. 2A-E. The feature 202 disposed in an upper surface 204 of the substrate 200 as depicted in FIG. 2A is merely representative and features having other geometries may also be filled in accordance with the teachings provided herein. For example, the feature 200 may be a trench, a via, a dual damascene structure, or any suitable structure than can be filled with a metal using the inventive methods discussed below. In addition, the substrate may be any suitable substrate, such as comprising silicon (Si) or any suitable substrate for use with metallization of a feature. The substrate may include one or more additional layers disposed thereon, such as dielectric layers, conductive layers, barrier layers, or the like. For example, in some embodiments, the substrate may include a barrier layer, or other layer, disposed atop the substrate and/or within the features in the substrate (upper layer 201 shown in phantom in FIG. 2A). Examples of such layers may include, but are not limited to layers formed from titanium (Ti), tantalum (Ta), cobalt (Co), ruthenium (Ru), or the like, or combinations thereof.

Figure 2B:
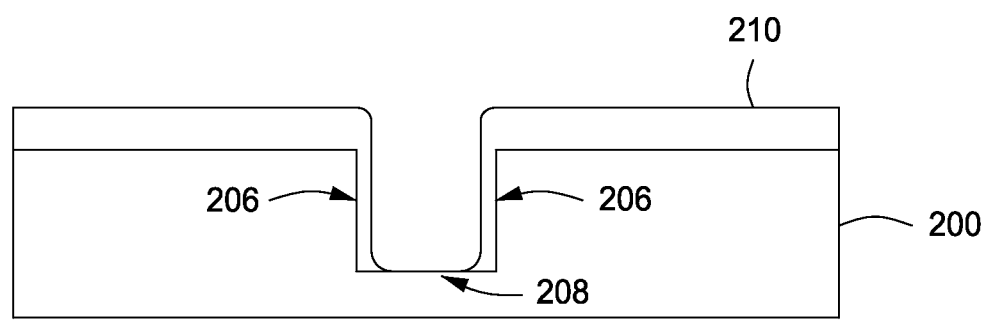
Figure 2C:
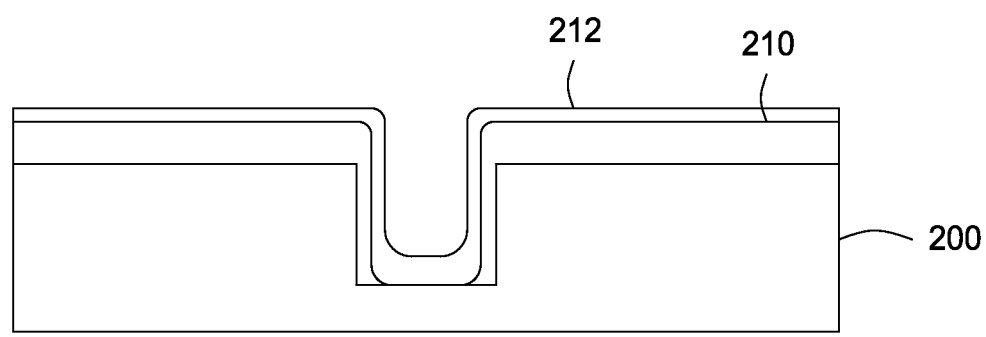

The method 100 begins at 102 where a material is deposited atop the upper surface 204 and atop one or more surfaces of the feature 202 by a first deposition process that deposits material at a greater rate on the upper surface 204 than on the one or more surfaces of the feature 202 (e.g., the first deposition process has a greater selectivity for deposition on the upper surface 204). For example, the material may be deposited on the upper surface 204, as well as sidewalls 206 and a bottom surface 208 of the feature, to form a first layer 210 of the deposited material, as illustrated in FIG. 2B. Due to the selectivity of the first deposition process, the first layer 210 may be thicker in regions disposed on the upper surface 204 as compared to one or more regions within the feature 202 (e.g., on the sidewalls 206, the bottom surface 208, or both).

As illustrated in FIG. 2B, the first deposition process, for example a physical vapor deposition process, may be configured to selectively deposit the material on the upper surface 204 of the substrate 200 rather than on the sidewalls 206 and the bottom surface 208 of the feature 202. The sidewalls 206 and the bottom surface 208 may be covered with the deposited material to a lesser thickness than the portion of the first layer 210 which is deposited on the upper surface 204 as shown in FIG. 2B, or portions of the sidewalls 206 and the bottom surface 208 of the feature may have gaps in coverage or no coverage with the deposited material at all. For example, for features having high aspect ratios (e.g., a ratio of height to width of the feature of about 4:1 or more) and/or critical dimensions of about 22 nm or less, coverage of the lower portions of such features (e.g., the lower portion of the sidewalls or the bottom surfaces) may be limited using the first deposition process.

Figure 3:
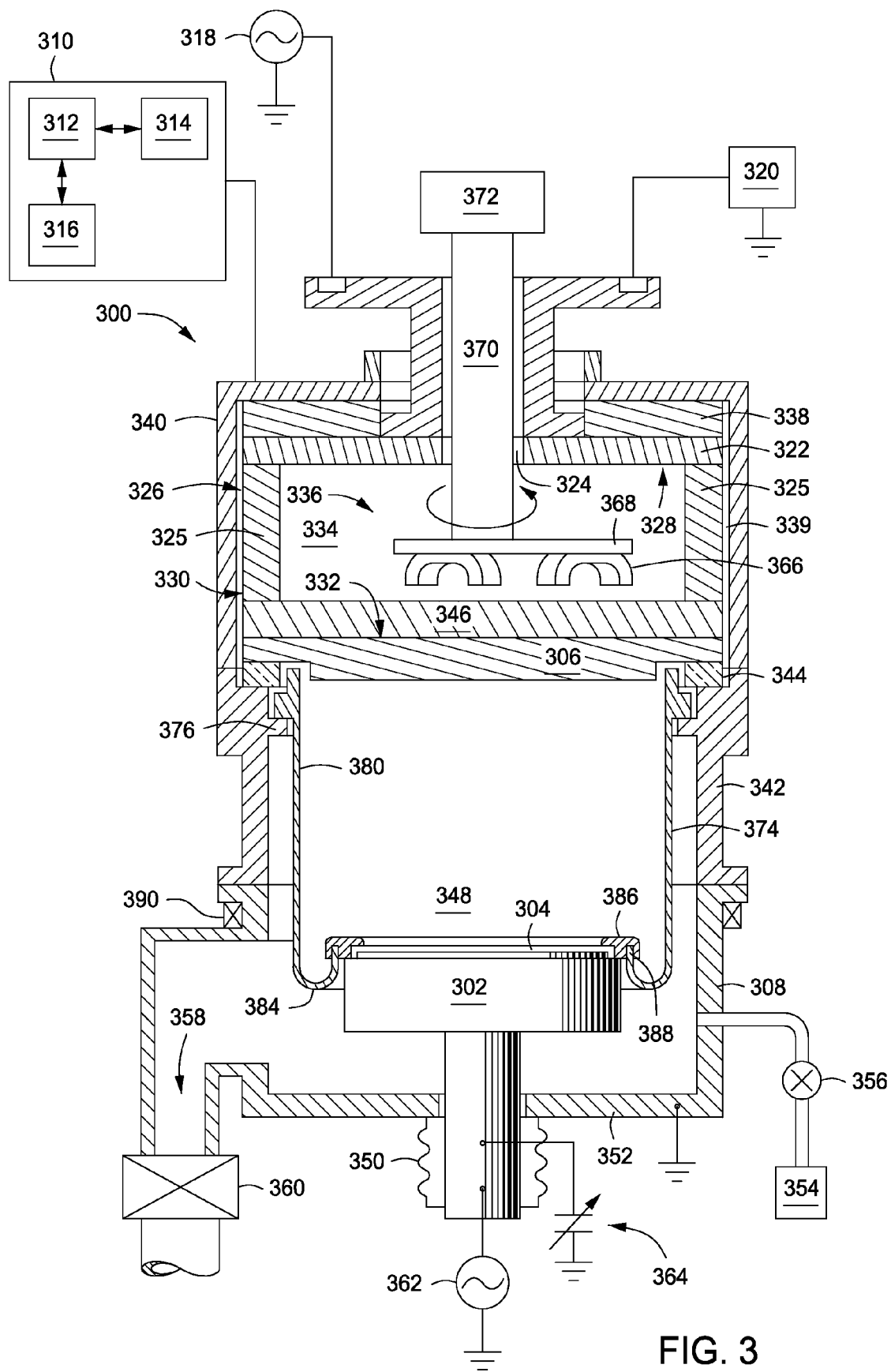
FIG. 3 depicts a schematic cross sectional view of a process chamber in accordance with some embodiments of the present invention.

The first deposition process may be performed in a physical deposition chamber, such as the process chamber 300 discussed below with respect to FIG. 3. The first deposition process may include providing a first RF bias power to the substrate 200, such that the material, for example sputtered from a target 306 of the process chamber 300 is selectively deposited on the upper surface 204 of the substrate 200. For example, the first RF bias power may be provided by an RF bias source 362 coupled a substrate support pedestal 302 of the process chamber 300 as depicted in FIG. 3 and discussed below. The first RF bias power may range from about 60 W to about 400 Watts. Further, the first RF bias power may be provided at a frequency ranging about 13.56 MHz. The first deposition process may have a selectivity for the upper surface 204 to the bottom surface 208 that is greater than 1.0, or from about 1.0 to about 0.75. In some embodiments, a pressure within the process chamber may be from about 0.5 to about 0.1 mTorr, during the first deposition process. In some embodiments, a temperature of the substrate may be maintained at less than about 100 degrees Celsius, for example, from about −20 to less than about 75 degrees Celsius, during the first deposition process. However, the temperature may depend upon the composition of the underlying layer upon which the material is being deposited in the first deposition process.

At 104, the material is deposited atop the upper surface 204 and the sidewalls 206 and bottom surface 208 of the feature 202 by a second deposition process that deposits material at a greater rate on the bottom surface 208 of the feature 202 than the upper surface 204 (e.g., the second deposition process has a greater selectivity for deposition on the bottom surface 208 of the feature 202). For example, in the embodiments illustrated in FIG. 2C, the material is deposited on the first layer 210 and exposed portions of the sidewalls 206 and the bottom surface 208 not covered by the first layer 210 to form a second layer 212. The portions of the first and second layers 210, 212 disposed above the bottom surface 208 of the feature 202 may be non-uniform due to uneven deposition of the first layer 210 on the bottom surface 208 by the first deposition process.

Further, the process described at 102 and 104 may be performed in either order. Accordingly, in some embodiments (not shown), the material can be deposited on the upper surfaces 204 and the sidewalls 206 and the bottom surface 208 of the features using the second deposition process to form the second layer 212 on the upper surface 204 and the sidewalls 206 and the bottom surface 208 of the feature 202 followed by the first layer 210 disposed atop the second layer 212 using the first deposition process. However, as depicted in the fabrication steps illustrated in FIGS. 2A-E, the first layer 210 is deposited atop the upper surface 204 and at least portions of the sidewalls 206 and/or bottom surface 208 of the feature 202 followed by the second layer 212 deposited atop the first layer 210. In such embodiments, the upper surface 204 and the corners of the feature 202 may be protected by the deposited material from the first deposition process prior to performing the second deposition process.

The second deposition process for depositing the material above the upper surface 204 and in the feature 202 may be performed in a physical deposition chamber, such as the process chamber 300 discussed below with respect to FIG. 3. The second deposition process may include providing a second RF bias power to the substrate 200, such that the material, for example sputtered from a target 306 of the process chamber 300 is selectively deposited on the bottom surface 208 of the feature 202. In some embodiments, the second RF bias power is greater than the first RF bias power. For example, the second RF bias power may be provided by an RF bias source 362 coupled a substrate support pedestal 302 of the process chamber 300 as depicted in FIG. 3 and discussed below. The second RF bias power may range from about 600 to about 1400 Watts. Further, the second RF bias power may be provided at a frequency ranging about 13.56 MHz. The second deposition process may have a selectivity for the upper surface 204 to the bottom surface 208 of less than about 1, and in some embodiments, ranging from about 0.1 to less than 0.6. In some embodiments, a pressure within the process chamber may be from about 0.5 to about 0.1 m Torr during the second deposition process. In some embodiments, a temperature of the substrate may be maintained at less than about 100 degrees Celsius, for example from about −20 to about 75 degrees Celsius, during the second deposition process. However, the temperature may depend upon the composition of the underlying layer upon which the material is being deposited in the second deposition process.

Figure 2D:
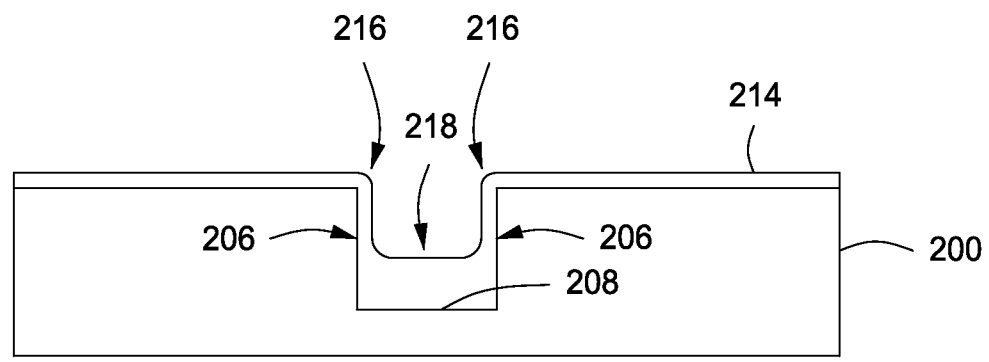

At 106, the material deposited in the first and second deposited layers 210, 212 may be heated, or annealed, to draw the deposited material into the feature 202 (for example, via capillary action), as illustrated in FIG. 2D. The material of the first and second deposited layers 210, 212 may be the same material, accordingly, the first and second layers 210, 212 are illustrated as a single layer 214 which may be drawn into the feature 202, as illustrated in FIG. 2D. For example, in some embodiments the material deposited in the first deposition process, described at 102, (e.g., a first material) comprises copper, or in some embodiments the material deposited in the first deposition process consists essentially of copper. In some embodiments the material deposited in the second deposition process, described at 104, (e.g., a second material) comprises copper, or in some embodiments the material deposited in the second deposition process consists essentially of copper. In addition, the material (e.g., the first material and the second material) may be any suitable material used in forming interconnect structures, such as aluminum (Al), copper alloys, or germanium antimony tellurium (GST) alloys, or the like, or combinations thereof.

The heating process at 106 may be performed in the process chamber 300 to heat the substrate 200 and facilitate reflow of the layer 214 into the feature 202. In some embodiments, the substrate 200 may be heated, for example, using a heater (not shown) disposed in the substrate support pedestal 302, or radiative lamps (not shown) that provide energy to the substrate (directly or indirectly) to heat the substrate 200. Alternatively, the heating process may be performed in a heating apparatus independent of the process chamber 300. The heating apparatus may be a separate process chamber configured to heat the substrate to the desired temperature, and may be a standalone process chamber or may be connected to the process chamber 300 via a transfer chamber of a cluster tool (not shown).

The heating process may be performed at a temperature ranging from about 150 to about 400 degrees Celsius. As illustrated in FIG. 2D, heating the layer 214 may facilitate reflow of the deposited layer 214 into the feature 202. For example, one or more first portions 216 of the layer 214 disposed on the substrate proximate the feature 202 may be thinner than a second portion 218 of the layer 214 disposed atop the bottom 208 of the feature 202 due to material in the layer 214 being drawn into the feature 202. Upon completion of the heating process, the bottom surface 208 of the feature 202 may be covered with deposited material. In some embodiments, a thickness of the layer 214 on the bottom surface 208 may be greater than a thickness of the layer 214 in other locations, such as on sidewalls of the feature 202 and/or on the surface of the substrate proximate the feature 202. In some embodiments, and as shown in FIG. 2D, the layer 214 may be substantially uniform above the bottom surface 208.

In some embodiments, an optional third deposition process may follow the heating process at 106 to deposit a layer of material atop the layer 214. The third deposition process may be a low energy deposition process, such as, a low temperature and low bias power deposition process performed using similar conditions as described above for the first deposition process at 102. As used herein, a low energy deposition process is performed at a low temperature and with a low bias power, such as the exemplary conditions disclosed above with respect to the first deposition process at 102.

Figure 2E:
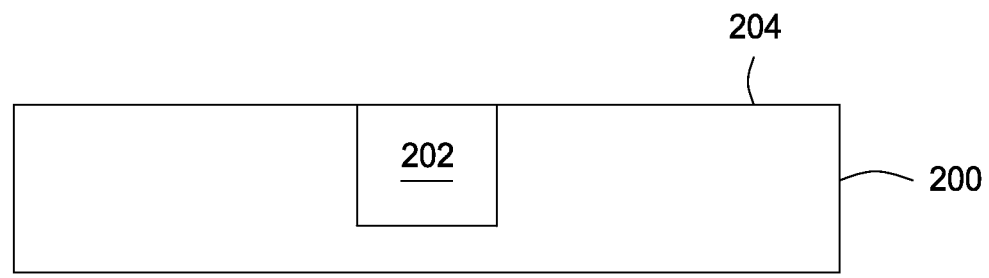

Upon completion of the heating process at 106, and the optional third deposition process, the method 100 may proceed to fill the feature 202 with the deposited material. In some embodiments, the feature 202 may be filled with the deposited material, for example, up to about an equivalent level with the upper surface 204 of the substrate 200, as illustrated in FIG. 2E. For example, as shown in phantom at 108, the feature 202 may be filled by repeating one or more of the first and second deposition processes and the heating process, described at 102-106 of the method 100 until the feature 202 is filled. For example, the first deposition process, the second deposition process and the heating process may be repeated for one or several iterations. Alternatively, the first and second deposition process and the heating process may be repeated for a number of iterations sufficient to fill the feature 202 to a level, such that aspect ratio or critical dimension is no longer a substantial concern. Then, the first process and the heating process may continue to be utilized until the feature 202 is filled completely.

Alternatively, upon completion of the heating process at 106, the layer 214 may be a sufficient seed layer covering the surfaces of the feature 202, such that other filling techniques may be employed. For example, a chemical vapor deposition process or the like may be used to complete the filling of the feature 202 up to the level of the upper surface 204 of the substrate 200.

Further, when the feature 202 has been filled by any of the methods discussed above, the feature 202 may be filled above the level of the upper surface 204 of the substrate and/or deposited material, for example from the layer 214, may remain on the upper surface 204 of the substrate 200. Accordingly, techniques, such as wet clean in an acidic solution, chemical mechanical polishing, or the like may be used to remove excess deposited material from the upper surface 204, such the feature is filled with the deposited material up to about an equivalent level with the upper surface 204.

FIG. 3 depicts a schematic, cross-sectional view of a physical vapor deposition chamber (process chamber 300) in accordance with some embodiments of the present invention. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive apparatus disclosed herein.

The process chamber 300 contains a substrate support pedestal 302 for receiving a substrate 304 thereon, and a sputtering source, such as a target 306. The substrate support pedestal 302 may be located within a grounded enclosure wall 308, which may be a chamber wall (as shown) or a grounded shield (a ground shield 340 is shown covering at least some portions of the chamber 300 above the target 306. In some embodiments, the ground shield 340 could be extended below the target to enclose the pedestal 302 as well).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an RF power source 318 and a DC power source 320, which can be respectively utilized to provide RF and DC energy to the target 306. For example, the DC power source 320 may be utilized to apply a negative voltage, or bias, to the target 306. In some embodiments, RF energy supplied by the RF power source 318 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 318 and the DC power source 320.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 125 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening of the body via the hole 324 of the source distribution plate 322. The cavity 334 and the central opening of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar 340 may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thereby improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 106 may be supported on a grounded conductive aluminum adapter 342 through a dielectric isolator 344. The target 306 comprises a material to be deposited on the substrate 304 during sputtering, such a metal or metal oxide. In some embodiments, the backing plate 346 may be coupled to the source distribution plate-facing surface 332 of the target 306. The backing plate 346 may comprise a conductive material, such as copper-zinc, copper-chrome, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the chamber 300 and thereafter raised to a deposition, or processing position. One or more processing gases may be supplied from a gas source 354 through a mass flow controller 356 into the lower part of the chamber 300. An exhaust port 158 may be provided and coupled to a pump (not shown) via a valve 360 for exhausting the interior of the process chamber 300 and facilitating maintaining a desired pressure inside the process chamber 300.

An RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired.

A rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the chamber 300 and the substrate 304. A motor 372 can be coupled to the upper end of the rotation shaft 370 to drive rotation of the magnetron assembly 336. The magnets 366 produce a magnetic field within the chamber 300, generally parallel and close to the surface of the target 306 to trap electrons and increase the local plasma density, which in turn increases the sputtering rate. The magnets 366 produce an electromagnetic field around the top of the chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the chamber 300 may further include a process kit shield 374 having an internal surface 380 facing the central region 348. In some embodiments, the process kit shield 374 may be connected to a ledge 376 of the adapter 342. The adapter 342 in turn is sealed and grounded to the aluminum chamber sidewall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in its lower, loading position but rests on the outer periphery of the substrate support pedestal 302 when it is in its upper, deposition position to protect the substrate support pedestal 302 from sputter deposition. An additional deposition ring (not shown) may be used to shield the periphery of the substrate 304 from deposition.

In some embodiments, a magnet 390 may be disposed about the chamber 200 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 434 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and sub-systems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

Thus, methods for forming interconnect structures have been disclosed herein. The inventive methods advantageously metalize features, such as a via or a trench, using metallization techniques, such as physical vapor deposition or the like, while limiting the formation of voids or defects in the features formed.

While the foregoing is directed to embodiments of the present invention, other and further embodiments of the invention may be devised without departing from the basic scope thereof.

The invention claimed is:

1. A method of forming an interconnect on a substrate, comprising:
    (a) depositing a material atop an upper surface of the substrate and atop one or more surfaces of a feature disposed in the substrate by a first physical vapor deposition process at a first temperature, which deposits the material at a greater rate on the upper surface than on a bottom surface of the feature;
    (b) prior to heating the material deposited in (a), depositing the material atop the upper surface of the substrate and atop one or more surfaces of the feature by a second physical vapor deposition process at a second temperature, which deposits the material at a greater rate on the bottom surface of the feature than on the upper surface of the substrate; and
    (c) after (a) and (b), heating the deposited material to a third temperature that is greater than the first temperature and the second temperature to draw the deposited material towards the bottom surface of the feature to only partially fill the feature with the deposited material.

2. The method of claim 1, further comprising:
    (d) repeating (a)-(b); and
    (e) after (d), heating the deposited material to a temperature that is greater than the first temperature and the second temperature to draw the deposited material towards the bottom surface of the feature to completely fill the feature with the deposited material.

3. The method of claim 1, wherein (a) further comprises biasing the substrate at a first RF bias power during the first deposition process and wherein (b) further comprises biasing the substrate at a second RF bias power during the second deposition process, wherein the second RF bias power is greater than the first RF bias power.

4. The method of claim 1, wherein (a) further comprises selectively depositing the material on the upper surface and on the one or more surfaces of the feature to form a first layer at least partially covering the upper surface and the one or more surfaces of the feature and wherein (b) further comprises selectively depositing the material on the first layer and on remaining exposed surfaces of the upper surface and the one or more surfaces of the feature.

5. The method of claim 1, wherein (b) further comprises selectively depositing the material on the upper surface and on the one or more surfaces of the feature to form a first layer at least partially covering the upper surface and the one or more surfaces of the feature and wherein (a) further comprises selectively depositing the material on the first layer and on remaining exposed surfaces of the upper surface and the one or more surfaces of the feature.

6. The method of claim 1, wherein the first physical vapor deposition process has a selectivity for the upper surface to the bottom surface of greater than about 1.0.

7. The method of claim 1, wherein the second physical vapor deposition process has a selectivity for the upper surface to the bottom surface of less than about 1.0.

8. The method of claim 1, wherein the feature comprises at least one of a trench or via.

9. The method of claim 1, wherein (c) further comprises:
heating the deposited material at a temperature ranging from about 150 to about 400 degrees Celsius.

10. The method of claim 1, further comprising:
   (d) repeating the first physical vapor deposition process after (c); and
   (e) filling a remainder of the feature with a conductive material.

11. The method of claim 1, wherein the material is one or more of copper, a copper alloy, aluminum (Al), or a germanium antimony tellurium (GST) alloy.

12. The method of claim 1, wherein the substrate includes an upper layer disposed at least within the feature, and wherein the material is deposited atop the upper layer.

13. The method of claim 1, wherein the bottom surface of the feature is covered with a layer of the deposited material after heating at (c).

14. The method of claim 13, wherein a thickness of the layer on the bottom surface is greater than a thickness of the layer on sidewalls of the feature and on the surface of the substrate proximate the feature.

15. The method of claim 13, wherein the layer on the bottom surface is substantially uniform.

16. The method of claim 1, wherein the first temperature is less than about 100 degrees Celsius and the second temperature is less than about 100 degrees Celsius.

17. The method of claim 16, wherein the third temperature is about 150 degrees Celsius to about 400 degrees Celsius.

18. A method of forming a layer in a feature disposed in a substrate, comprising:
   (a) depositing a material on an upper surface of the substrate and within a feature disposed in the substrate by a first physical vapor deposition process at a first temperature;
   (b) prior to heating the material deposited in (a), continuing to deposit the material on the upper surface of the substrate and within the feature by a second physical vapor deposition process at a second temperature, wherein one of the first physical vapor deposition process or the second physical vapor deposition process deposits the material at a greater rate on the upper surface of the substrate than on a bottom surface of the feature, and wherein the other of the first physical vapor deposition process or the second physical vapor deposition process deposits the material at a greater rate on the bottom surface of the feature than on the upper surface of the substrate; and
   (c) after (a) and (b), heating the deposited material to a third temperature that is greater than the first temperature and the second temperature to draw the deposited material towards the bottom surface of the feature to only partially fill the feature with the deposited material.

19. The method of claim 18, further comprising:
   (d) repeating (a)-(b); and
   (e) after (d), heating the deposited material to a temperature that is greater than the first temperature and the second temperature to draw the deposited material towards the bottom surface of the feature to completely fill the feature with the deposited material.

20. The method of claim 18, further comprising:
   (d) repeating (a)-(c) until a layer of deposited material is formed within the feature; and
   (e) depositing the material atop the layer by electroplating until the feature is filled with the deposited material.

21. The method of claim 20, further comprising:
   (f) prior to (e), depositing the material atop the layer of deposited material resultant from (d) using a low energy deposition process.

22. A computer readable medium having instructions stored thereon that, when executed by a processor, cause a process chamber to perform a method, comprising:
   (a) depositing a material atop an upper surface of the substrate and atop one or more surfaces of a feature disposed in the substrate by a first physical vapor deposition process at a first temperature, which deposits the material at a greater rate on the upper surface than on a bottom surface of the feature;
   (b) prior to heating the material deposited in (a), depositing the material atop the upper surface of the substrate and atop one or more surfaces of the feature by a second physical vapor deposition process at a second temperature, which deposits the material at a greater rate on the bottom surface of the feature than on the upper surface of the substrate, wherein the substrate is at a second temperature; and
   (c) after (a) and (b), heating the deposited material to a third temperature that is greater than the first temperature and the second temperature to draw the deposited material towards the bottom surface of the feature to only partially fill the feature with the deposited material.

\* \* \* \* \*